United States Patent
Lee et al.

(10) Patent No.: US 11,463,131 B2
(45) Date of Patent: Oct. 4, 2022

(54) ELECTRONIC DEVICE INCLUDNG COILS

(71) Applicant: Samsung Electronics Co., Ltd., Gyeonggi-do (KR)

(72) Inventors: Woosup Lee, Gyeonggi-do (KR); Sungnam Kang, Gyeonggi-do (KR); Jungoh Sung, Gyeonggi-do (KR)

(73) Assignee: Samsung Electronics CO., LTD., Suwon-si (KR)

( * ) Notice: Subject to any disclaimer, the term of this patent is extended or adjusted under 35 U.S.C. 154(b) by 28 days.

(21) Appl. No.: 17/118,776

(22) Filed: Dec. 11, 2020

(65) Prior Publication Data

US 2021/0185843 A1 Jun. 17, 2021

(30) Foreign Application Priority Data

Dec. 13, 2019 (KR) .......................... 10-2019-0166768

(51) Int. Cl.
| | |
|---|---|
| *H01F 27/28* | (2006.01) |
| *H04B 5/00* | (2006.01) |
| *H05K 1/02* | (2006.01) |
| *H02J 50/10* | (2016.01) |
| *H02J 7/02* | (2016.01) |

(52) U.S. Cl.
CPC ....... *H04B 5/0037* (2013.01); *H01F 27/2804* (2013.01); *H05K 1/0277* (2013.01); *H02J 7/02* (2013.01); *H02J 50/10* (2016.02); *H05K 2201/10189* (2013.01)

(58) Field of Classification Search
CPC ......................................... H01F 27/2804–2828
See application file for complete search history.

(56) References Cited

U.S. PATENT DOCUMENTS

| | | | | |
|---|---|---|---|---|
| 2008/0297295 A1* | 12/2008 | Yamazaki | ............. | H01F 27/361 336/90 |
| 2014/0168019 A1* | 6/2014 | Hirobe | .................... | H02J 7/025 343/788 |
| 2016/0094082 A1* | 3/2016 | Ookawa | ................ | H01M 10/46 320/108 |
| 2018/0138746 A1* | 5/2018 | Jang | ...................... | H01F 27/366 |

(Continued)

FOREIGN PATENT DOCUMENTS

| | | |
|---|---|---|
| JP | 2014183469 A | 9/2014 |
| KR | 10-2016-0078843 A | 7/2016 |

(Continued)

OTHER PUBLICATIONS

International Search Report dated Apr. 14, 2021.

*Primary Examiner* — Hoa C Nguyen
(74) *Attorney, Agent, or Firm* — Cha & Reiter, LLC

(57) ABSTRACT

Certain embodiments relate to an electronic device including a wireless communication circuit, an flexible printed circuit board (FPCB) electrically coupled with the wireless communication circuit, a first coil formed on the FPCB, a power management circuit, and a second coil electrically coupled with the power management circuit and including a spiral pattern formed thereon by a winding at least one wire, wherein the second coil includes a first end disposed on an outer edge of the spiral pattern, and a second end disposed on an inner edge of the spiral pattern, and wherein an electric path extending from the second end to the first end is disposed on the FPCB.

15 Claims, 7 Drawing Sheets

(56) References Cited

U.S. PATENT DOCUMENTS

| | | | | |
|---|---|---|---|---|
| 2018/0198310 A1* | 7/2018 | Hwang | ................ | H02J 7/0042 |
| 2018/0301790 A1* | 10/2018 | Kim | ................... | H04B 5/0037 |
| 2019/0109373 A1* | 4/2019 | Ahn | ....................... | H01Q 7/00 |
| 2019/0252768 A1 | 8/2019 | Kim et al. | | |
| 2020/0051734 A1* | 2/2020 | Won | ....................... | H01F 38/14 |
| 2020/0090858 A1* | 3/2020 | Hong | ................... | H01F 27/29 |

FOREIGN PATENT DOCUMENTS

| | | |
|---|---|---|
| KR | 10-2016-0078847 A | 7/2016 |
| KR | 10-1741364 B1 | 5/2017 |
| KR | 10-1795545 B1 | 11/2017 |
| KR | 10-2018-0097250 A | 8/2018 |
| KR | 10-1899317 B1 | 9/2018 |
| KR | 10-1901715 B1 | 9/2018 |
| KR | 10-2018-0116721 A | 10/2018 |
| WO | 2016/117951 A1 | 7/2016 |

\* cited by examiner

ELECTRONIC DEVICE INCLUDNG COILS

CROSS-REFERENCE TO RELATED APPLICATION(S)

This application is based on and claims priority under 35 U.S.C. § 119 to Korean Patent Application No. 10-2019-0166768, filed on Dec. 13, 2019, in the Korean Intellectual Property Office, the disclosure of which is herein incorporated by reference in its entirety.

BACKGROUND

Field

Certain embodiments relate to an electronic device including coils for transmitting and receiving power and data to and from an external electronic device.

Description of Related Art

Recently released electronic devices may support technology for transmitting power or data via magnetic induction, which uses coils to provide various services to users. For example, an electronic device may transmit power using standards defined by wireless power consortium (WPC) or alliance for wireless power (A4WP), etc., and transmit data by using magnetic secure technology (MST), near field communication (NEC), etc.

In particular, electronic devices may be provided with a plurality of coils formed on a flexible printed circuit board (FPCB) that are optimized for wireless charging, MST, NEC technologies in order to transmit power and/or data.

The above information is presented as background information only to assist with an understanding of the disclosure. No determination has been made, and no assertion is made, as to whether any of the above might be applicable as prior art with regard to the disclosure.

SUMMARY

In order to implement wireless charging, MST, and NEC functionality, a device may be equipped with coils for wireless charging, coils for MST, coils for NEC. These coils are typically formed on an FPCB.

However, to form the coils for wireless charging, the coils for MST, the coils for NEC on the FPCB all together, an expensive FPCB may be utilized as to provide a large mounting area. This creates potential issues in that the complexity of physical arrangement of components and wiring for the coils may increase.

In addition, in the case of a miniaturized electronic device such as a smartphone, if the different coils (for example, wireless charging, MST, NFC) are arranged all together, performance of the coils may be degraded due to electronic interference between the coils, which is exacerbated since compact electronic device have limits to area and thickness.

In addition, for wireless charging coils, as the coils are divided into more and more strands, resistance values of the coils may be reduced and frequency characteristics (such as, for example, a Q-factor) may be enhanced, so that wireless charging efficiency may be enhanced. However, if the coils for wireless charging are formed on an FPCB, it may be difficult to divide the coils into as many strands as desired because of physical limits of space and arrangement.

To solve the above-described problems, the disclosure provides an electronic device which includes coils for supporting communication technology for transmitting and receiving power and/or data to and from an external electronic device, and has some of the coils formed by wires and has the other coils formed on an FPCB.

The technical object to be achieved by the disclosure is not limited to that mentioned above, and other technical objects that are not mentioned above may be clearly understood to those skilled in the art based on the description provided below.

According to an embodiment, an electronic device may include: a wireless communication circuit, an flexible printed circuit board (FPCB) electrically coupled with the wireless communication circuit, a first coil formed on the FPCB, a power management circuit, and a second coil electrically coupled with the power management circuit and including a spiral pattern formed thereon by a winding at least one wire, wherein the second coil includes a first end disposed on an outer edge of the spiral pattern, and a second end disposed on an inner edge of the spiral pattern, and wherein an electric path extending from the second end to the first end is disposed on the FPCB.

According to an embodiment, an electronic device may include: an FPCB including a connection terminal electrically connected with one or more components included in the electronic device, a first coil including a first wire formed on a first surface of the FPCB, and a second wire formed on a second surface of the FPCB, the second surface facing an opposite direction relative to the first surface, and a second coil including a spiral pattern formed therein by winding at least one wire by at least one turn, wherein the second coil includes a first end disposed on an outer edge of the spiral pattern, a second end disposed on an inner edge of the spiral pattern, and an electric path coupling each of the first end and the second end with the connection terminal included on the FPCB.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Hereinafter, certain embodiments of the disclosure will be described in detail with reference to the accompanying drawings.

Figure 1:
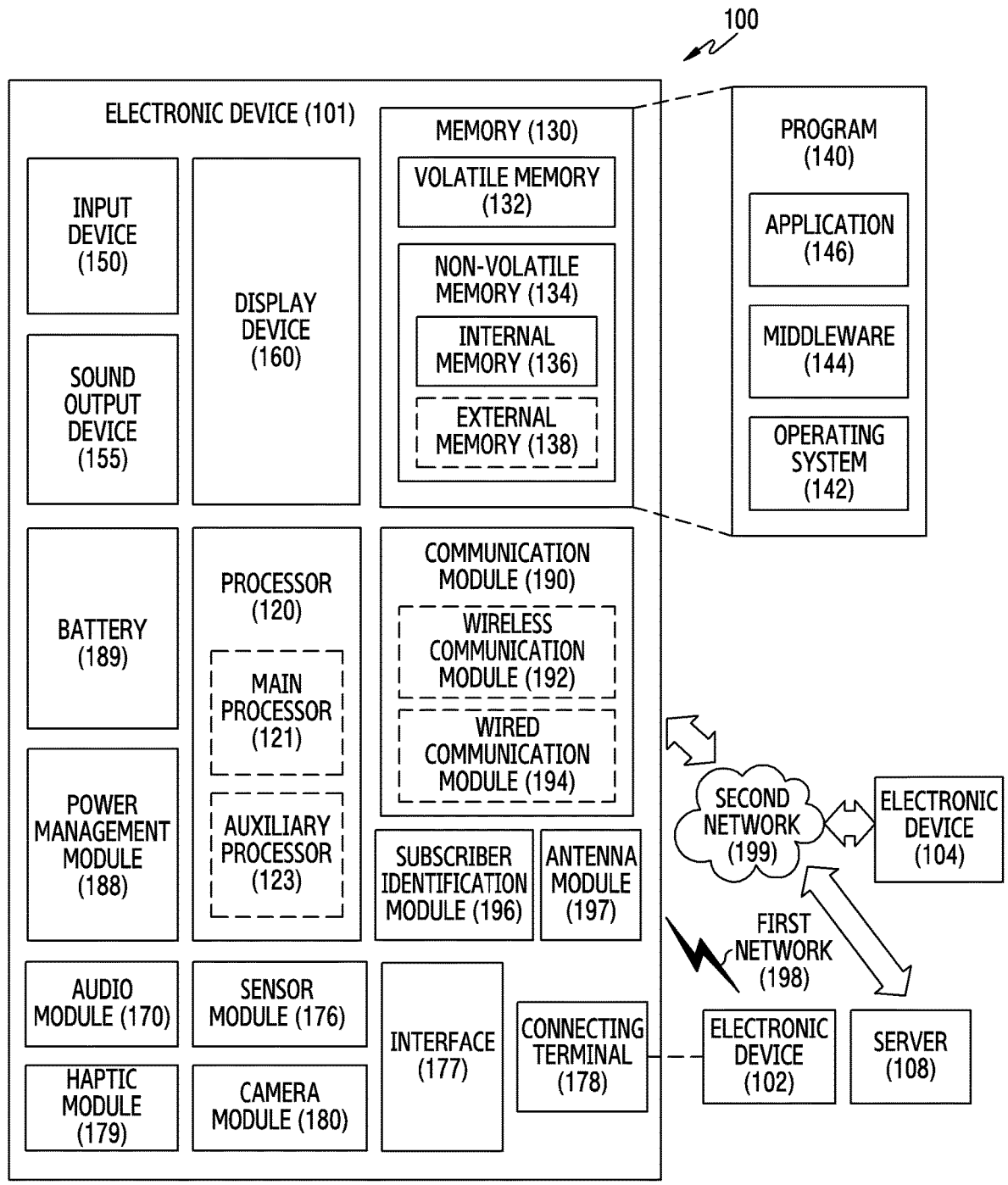
FIG. 1 is a block diagram of an electronic device in a network environment according to certain embodiments.

FIG. 1 is a block diagram illustrating an electronic device 101 in a network environment 100 according to certain embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to an embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123.

The memory 130 may store various data used by at least one component (e.g., the processor 120 or the sensor module 176) of the electronic device 101. The various data may include, for example, software (e.g., the program 140) and input data or output data for a command related thererto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, a keyboard, or a digital pen (e.g., a stylus pen).

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to an embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as Bluetooth™, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include an antenna including a radiating element implemented a conductive material or a conductive pattern formed in or on a substrate (e.g., PCB). According to an embodiment, the antenna module 197 may include a plurality of antennas. In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. According to an embodiment, another component (e.g., a radio frequency integrated circuit (RFIC)) other than the radiating element may be additionally formed as part of the antenna module 197.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

Figure 2:
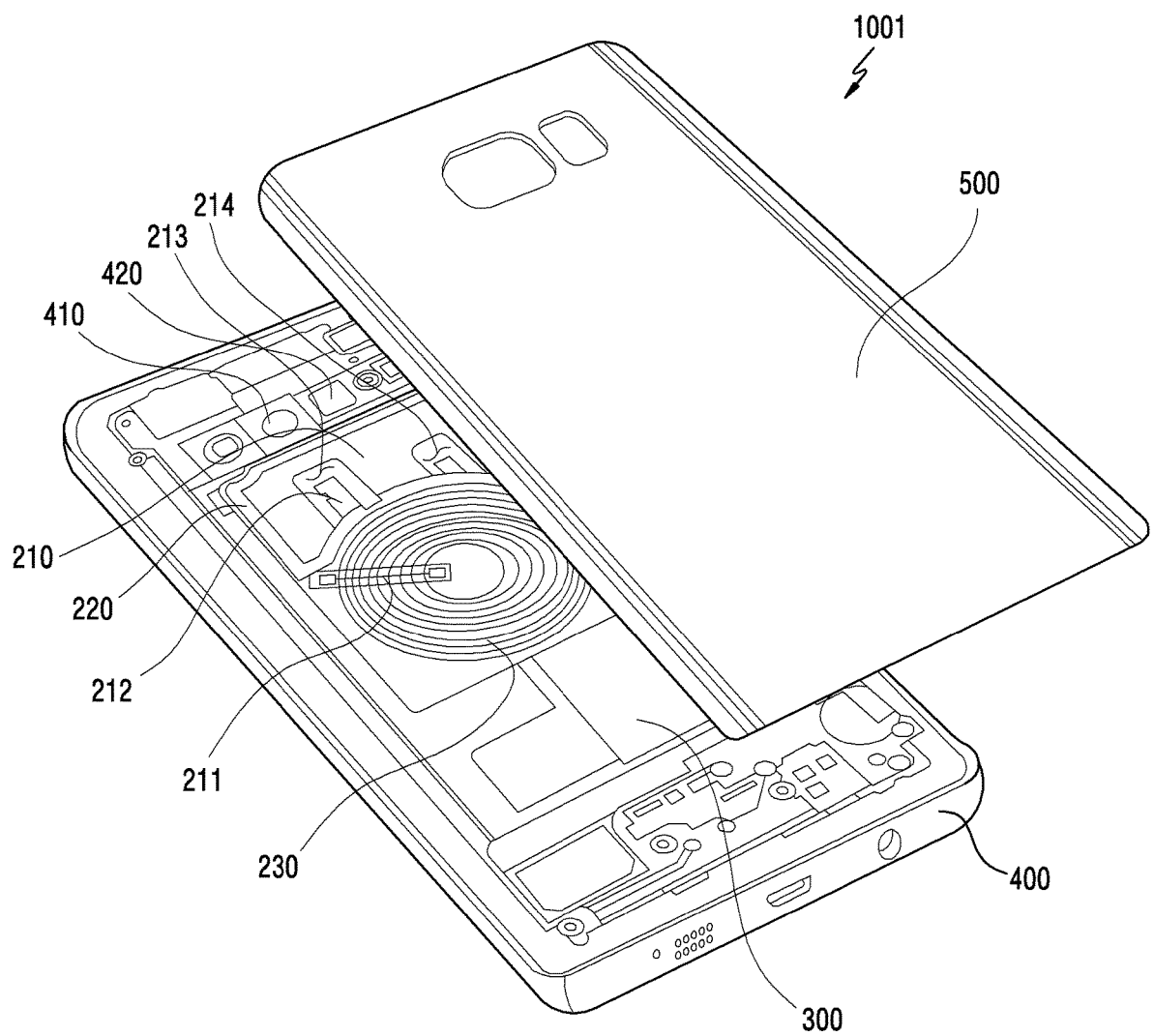
FIG. 2 is an exploded perspective view illustrating a state in which coils for supporting wireless communication technology are mounted in an electronic device according to certain embodiments.

FIG. 2 is an exploded perspective view illustrating a state in which coils for supporting wireless communication technology are mounted in an electronic device 1001 according to certain embodiments.

Referring to FIG. 2, the electronic device 1001 according to certain embodiments may include a housing 400 forming a side surface of the electronic device 1001, a front surface plate (not shown) which forms a front surface of the electronic device 1001 and including at least a portion of which is substantially transparent, and a rear surface plate 500 forming a rear surface of the electronic device 1001.

According to an embodiment, an inner space may be formed in the housing 400 between the front surface plate and the rear surface plate 500, and coils for supporting wireless communication technology may be mounted in the inner space adjacent to the rear surface plate 500.

In an embodiment, the electronic device 1001 may include an FPCB 210, a first coil 220 and a second coil 230. For example, the FPCB 210 may include the first coil 220, a connection terminal 212, at least one opening 213, 214, and a protrusion 211 connected with both ends of the second coil 230.

According to an embodiment, a battery 300 (for example, the battery 189 of FIG. 1) may be disposed under the coils for supporting the wireless communication technology when the electronic device 1001 is viewed from the rear surface. In addition, a camera 410 or a sensor 420 may be disposed on one side of the coils for supporting the wireless communication technology when the electronic device 1001 is viewed from the rear surface. For example, the first coil 220 and/or the second coil 230 may surround the camera 410 or the sensor 420, or patterns of the first coil 220 and/or the second coil 230 may be designed to detour to avoid overlapping components like the camera 410 or the sensor 420.

Figure 3:
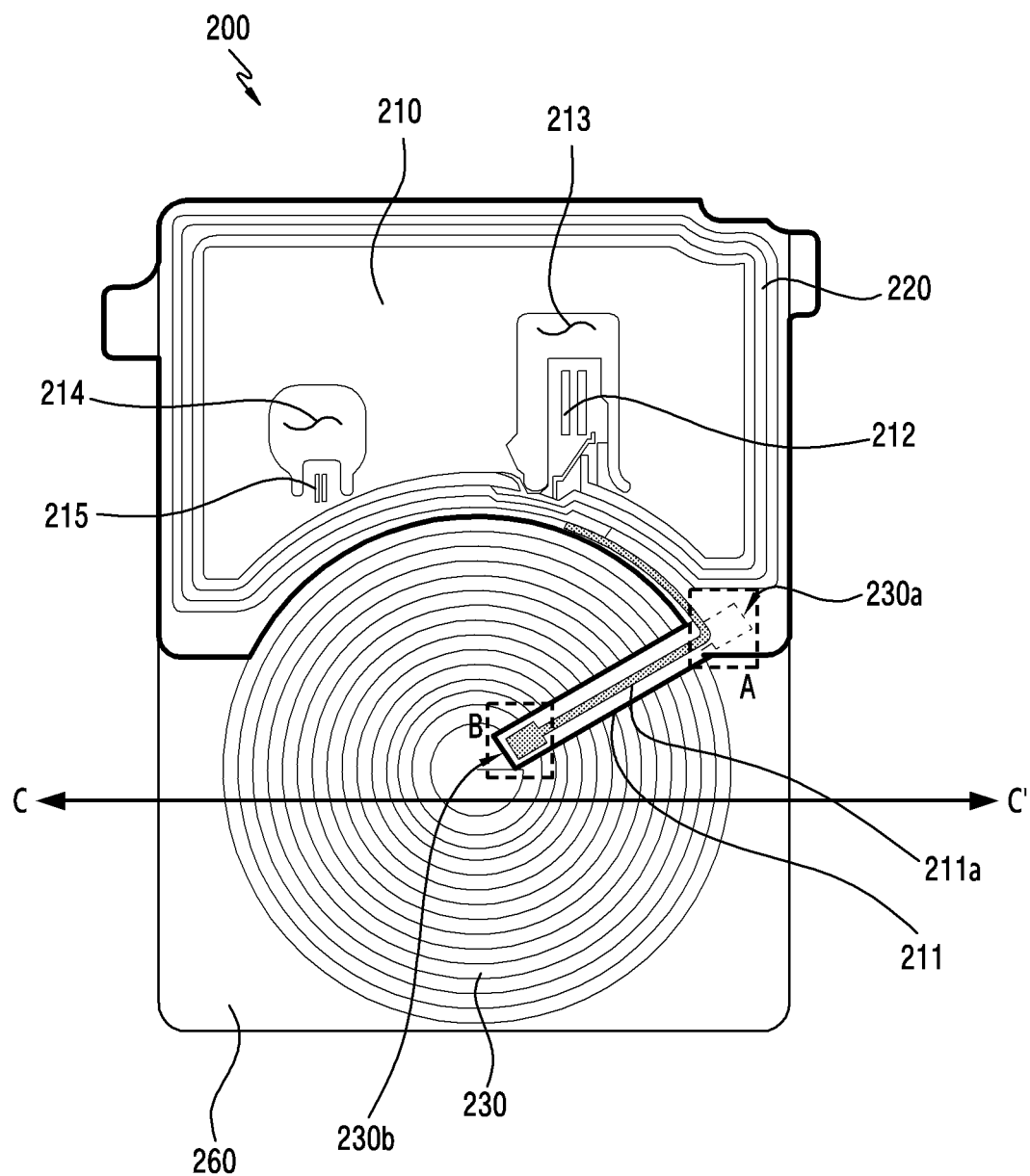
FIG. 3 is a view illustrating a structure of coils for supporting wireless communication technology, included in an electronic device according to certain embodiments.
Figure 4:
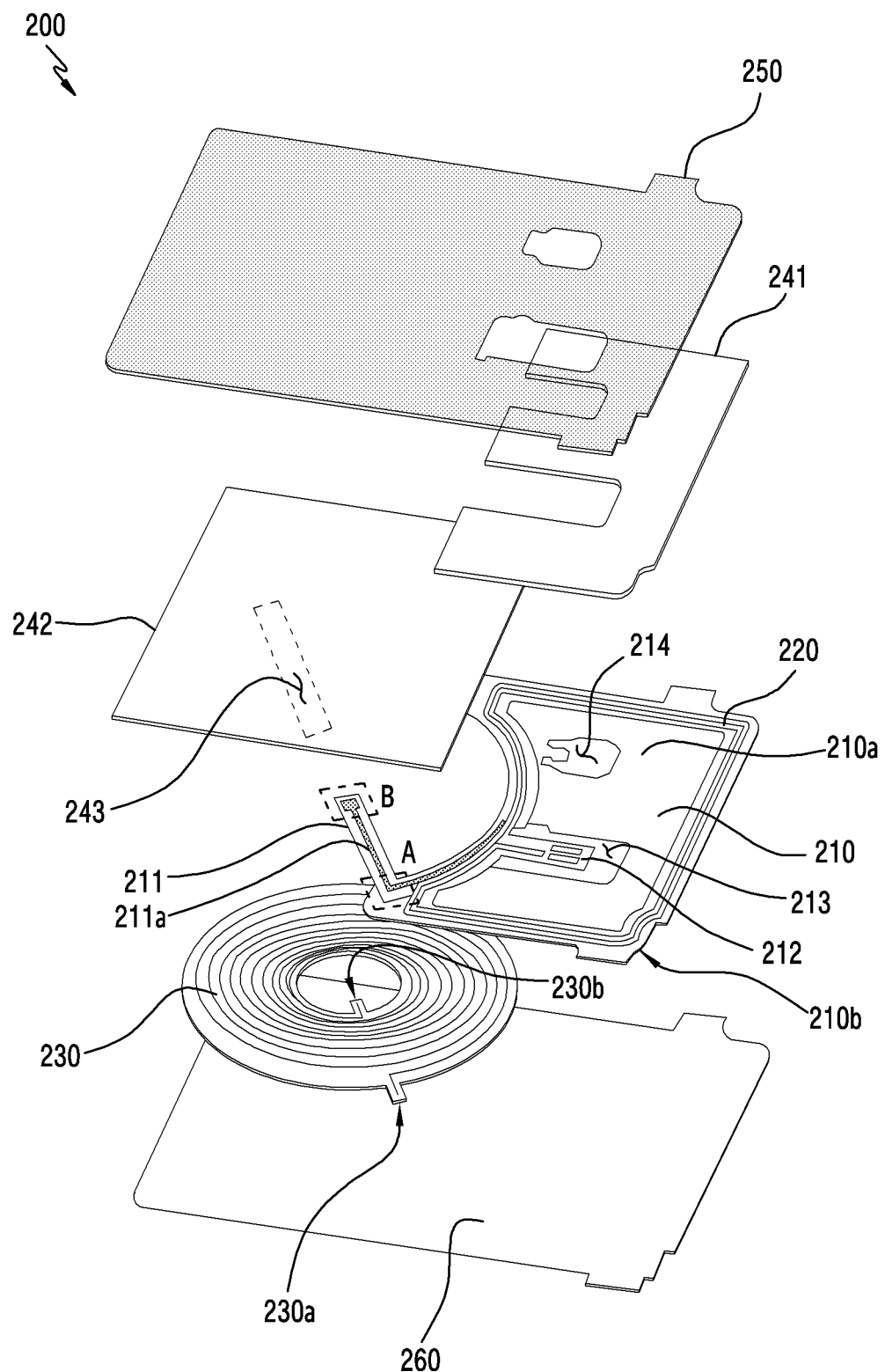
FIG. 4 is an exploded perspective view illustrating a structure of coils for supporting wireless communication technology, included in an electronic device according to certain embodiments.

FIG. 3 is a view illustrating a structure 200 of coils for supporting wireless communication technology, included in an electronic device according to certain embodiments, and FIG. 4 is an exploded perspective view of the structure 200 of the coils for supporting wireless communication technology, included in the electronic device according to certain embodiments.

Referring to FIGS. 3 and 4, the structure 200 of the coils included in the electronic device (such as, for example, the electronic device 101 of FIG. 1, the electronic device 1001 of FIG. 2) according to certain embodiments may include an FPCB 210, a first coil 220, and a second coil 230. In the structure 200 of the coils, the FPCB 210 having the first coil 230 formed thereon may be disposed on one side, and the second coil 230 may be disposed on the other side. For example, the first coil 220 and the second coil 230 may be disposed as to be misaligned from each other, such that the center of the first coil 220 and the center of the second coil 230 do not coincide. In the structure 200 of the coils illustrated in FIG. 4, the first coil 220 and the second coil 230 are disposed to avoid any overlapping areas therebetween, but this should not be considered as limiting. For example, the first coil 220 and the second coil 230 may be disposed to overlap each other in some areas in other embodiments.

According to an embodiment, the FPCB 210 may include the first coil 220, a connection terminal 212, at least one opening 213, 214, and a protrusion 211 connected with both ends of the second coil 230. The FPCB 210 may include a circuit wire formed on one surface or both surfaces thereof. If the FPCB 210 includes a circuit wire formed on both surfaces thereof, the first coil 220 may be formed on both surfaces of the FPCB 210 in the form of a loop-shaped circuit wire. For example, the loop-shaped circuit wire may be manufactured by patterning copper clad laminates (CCL) on both surfaces, or may be formed on both surfaces of the FPCB 210 by using photolithography.

In an embodiment, the FPCB 210 may be connected with both ends of the second coil 230 to electrically couple the second coil 230 with one or more components of the electronic device (for example, the electronic device 101 of FIG. 1, the electronic device 1001 of FIG. 2). The FPCB 210 may include the protrusion 211, which may extend from one end (for example, 230*a*) of the second coil 230 toward the other end (for example, 230*b*) to electrically couple the second coil 230 with one or more components of the electronic device. For example, when the second coil 230 includes a spiral pattern, the first end 230*a* is positioned on an outer edge of the spiral pattern and the second end 230*b* is positioned on an inner edge of the spiral pattern, there may be an electric path in the FPCB 210 that extends from the second end 230*b* of the second coil 230 toward the first end 230*a*. In this case, the protrusion 211 may extend from the first end 230*a* of the second coil 230 toward the second end 230*b*, and the electric path may be provided by an electric connection using a circuit wire 211*a* formed on one surface of the protrusion 211 with at least a certain area of the second coil 230 that corresponds to the circuit wire 211*a* of a lower end of the protrusion 211.

In an embodiment, the FPCB 210 may include a connection terminal 212 to electrically connect the first coil 220 and/or the second coil 230 with one or more components of the electronic device (such as, for example, the electronic device 101 of FIG. 1, the electronic device 1001 of FIG. 2). For example, the first coil 220 may be connected with a wireless communication circuit (such as, for example, a wireless communication module 192 of FIG. 1) of the electronic device through the connection terminal 212. In another example, the second coil 230 may be connected with a power management circuit (such as, for example, a power management module 188 of FIG. 1) of the electronic device through the connection terminal 212. In still another example, the second coil 230 may be connected with an MST control circuit of the electronic device through the connection terminal 212.

In an embodiment, the first coil 220 may include multiple coils disposed on both surfaces of the FPCB 210 facing each other, and accordingly, may be divided into a first wire formed on a first surface of the FPCB 210 facing in a first direction (for example, the z+ direction), and a second wire formed on a second surface 210*b* of the FPCB 210 facing in a second direction (for example, the −z direction) opposite to the first direction. The first wire and the second wire may be formed in a loop shape, including at least one turn, and may be formed along the border of the FPCB 210 in the form of a circuit wire. For example, the first wire and the second wire may be manufactured by patterning copper clad laminates (CCL) on both surfaces, or may be formed on the both surfaces of the FPCB through photolithography.

In an embodiment, the first wire and the second wire may be configured in the same loop shape. Both ends of the first wire and the second wire may be drawn out to the connection terminal 212, and may be electrically connected with the connection terminal 212. Through the connection, the first coil 220 may be connected with the wireless communication circuit (such as, for example, the wireless communication module 292 of FIG. 2) of the electronic device.

In an embodiment, at least one opening 213, 214 may be formed on the FPCB 210. The at least one opening 213 may include, for example, a first opening 213 formed on an area adjacent to the connection terminal 212, and/or a second opening 214 spaced apart from the connection terminal 212.

The first opening 213 may be formed on the periphery of the connection terminal 212 to allow at least a certain area of the connection terminal 212 to be positioned lower than the first coil 220 (such as, for example, the −z direction of FIG. 4). The second opening 214 may be formed on the FPCB 210, spaced apart from the connection terminal 212, and may form a space for assembly of an inner component of the electronic device. In this case, a thermistor 215 (e.g., a resistor whose resistance value changes according to a temperature) may be disposed on an area adjacent to the second opening 214, and the electronic device may control heat emission of the electronic device based on a resistance value of the thermistor 215. A detailed description thereof is omitted. It is illustrated in the drawings that both the first opening 213 and the second opening 214 are formed on the FPCB 210, but this should not be considered as limiting, and according to other embodiments, at least one of the first opening 213, the second opening 214 may not be formed.

According to certain embodiments, the first coil 220 may be a NEC coil for NFC communication. NEC communication uses a relatively high frequency of about 13.56 MHz, and is susceptible to a frequency deviation. Therefore, when the first coil 220 is used for NFC communication, the first coil 220 as formed on the FPCB can further reduce degradation in communication performance, compared to formation of the first coil 220 by wire.

According to certain embodiments, the second coil 230 may be formed in a spiral pattern by winding at least one wire. As the second coil 230 is formed by the wire rather than being formed on an FPCB, the second coil 230 may be implemented at a relatively low cost, and, since formation of the second coil by wire has few constraints on design in comparison to the formation of a coil on the FPCB. Accordingly, at least one turn of the second coil may be divided into a plurality of strands. As a result, a resistance value of the second coil 230 can be reduced and frequency characteristics may be enhanced, and wireless charging efficiency can further be enhanced as compared to forming the second coil 230 on the FPCB.

In an embodiment, the spiral pattern of the second coil 230 may be substantially circular as shown in FIG. 3. However, this should not be considered as limiting, and the pattern of the second coil 230 may have other shapes as well, such as a rectangular shape having substantially rounded corner. The second coil 230 may be formed by seamlessly winding at least one wire from outside to inside while overlapping in parallel. Herein, the direction in which at least one wire is wound is the direction from outside to inside, but this should not be considered as limiting, and at least one wire may be wound from inside to outside.

In an embodiment, the second coil 230 may include two ends, and the both ends of the second coil 230 may be divided into the first end 230a positioned on an outer edge of the spiral pattern and the second end 230b positioned on an inner edge of the spiral pattern. The first end 230a may include a bundle of one end of the at least one wire (e.g., a bundle of multiple wires), and the second end 230b may be a bundle of the other end of the at least one wire (e.g., a bundle of multiple wires). For example, the first end 230a of the second coil 230 may be soldered to electrically connect the respective bundles at each end of the at least one wire to one another. The second end 230b of the second coil 230 may be soldered to electrically connect the bundle of the other end of the at least one wire. The at least one wire implementing the second coil 230 may be connected with each other in parallel through soldering. Herein, soldering may be used to electrically connect one end or the other end of the at least one wire, but this should not be considered as limiting, and other means such as a conductive tape, a C-clip, a pogo-pin, or the like may be used to electrically connect the end of the wire. The structure of the second coil 230 will be described in detail below.

According to an embodiment, both ends (such as, for example, the first end 230a and the second end 230b) of the second coil 230 may be connected with the FPCB 210, and the second coil 230 may be electrically connected with one or more components of the electronic device (such as, for example, the electronic device 101 of FIG. 1, the electronic device 1001 of FIG. 2) through the FPCB 210. For example, the FPCB 210 may include the protrusion 211 extending from the body of the FPCB 210 from the first end 230a of the second coil 230 toward the second end 230b of the second coil 230, and the first end 230a of the second coil 230 may be connected with an area (e.g., A area) close to the body of the protrusion, and the second end 230b of the second coil 230 may be connected with an extended area (e.g., B area) of the protrusion.

In an embodiment, the protrusion 211 may include the circuit wire 211a formed thereon to electrically connect the second coil 230 with one or more components of the electronic device. The circuit wire 211a may electrically connect the both ends 230a, 230b of the second coil 230 with the connection terminal 212. The second coil 230 may be a wireless charging coil for wirelessly charging, and in this case, the second coil 230 may be connected with the power management circuit (such as, for example, the power management module 188 of FIG. 1) of the electronic device through the circuit wire 211a formed on the protrusion 211 and the connection terminal 212. Alternatively, the second coil 230 may be an MST coil for implementing magnetic secure transmission corresponding to a magnetic payment card, and in this case, the second coil 230 may be connected with the MST control circuit of the electronic device through the circuit wire 211a formed on the protrusion 211, and the connection terminal 212. The case where the second coil 230 is the MST coil will be described in detail below.

The structure 200 of the coils included in the electronic device (such as, for example, the electronic device 101 of FIG. 1, the electronic device 1001 of FIG. 2) according to certain embodiments may further include a first magnetic substance 241 and a second magnetic substance 242. The structure 200 of the coils may include the first coil 220 and the second coil 230 which support communication technologies operating at different frequencies, and the first coil 220 and the second coil 230 may be disposed to have their centers misaligned relative to one another. Alternatively, the first coil 220 and the second coil 230 may be disposed to avoid an overlapping area therebetween. In this case, the first coil 220 and the second coil 230 may use magnetic substances of different materials, respectively, which have permeability corresponding to frequency characteristics of communication technologies supported by the first coil 220 and the second coil 230, since the first coil 220 and the second coil 230 are disposed on different areas.

In an embodiment, the first magnetic substance 241 may be formed in a sheet shape, and may be disposed on one surface of the first coil 220 and attached to the first coil 220. For example, the first magnetic substance 241 may be a ferrite sheet for enhancing data communication performance of the first coil 220, which may be a coil for NFC. The second magnetic substance 242 may also be formed in a sheet shape, and may be disposed on one surface of the second coil 230 and attached to the second coil 230. In an embodiment, the second magnetic substance 242 may have at least one recess 243 formed thereon. The recess 243 may compensate for an increase of thickness of the structure 200 of the coils caused by the protrusion 211, and a detailed description thereof is provided below.

For example, the second magnetic substance 242 may be a sheet having a nanostructure of metal series which can enhance communication performance of the second coil 230, which may be a wireless charging coil and/or an MST coil. Although the first magnetic substance 241 and the second magnetic substance 242 described above have different materials, this should not be considered as limiting. According to certain embodiments, the first magnetic substance 241 and the second magnetic substance 242 may be formed as one sheet of the same material.

According to an embodiment, the FPCB 210 or the second coil 230 may have an element attached to at least one of a first surface which faces in the first direction (for example, the +z direction), and a second surface which faces in the second direction (for example, the −z direction) opposite to the first direction. For example, a heatsink sheet 250 (such as, for example, a graphite sheet) for preventing heat dissipation, or a shielding member (such as, for example, a shielding sheet) for preventing damage to other components, caused by a strong induced electromagnetic field, may be attached to at least one of the first surface and the second surface of the FPCB 210 or the second coil 230. In another example, a protection film may be attached to prevent damage to the FPCB 210. In still another example, a black pet or a sponge may be attached as a support member to support the FPCB 210 or the second coil 230. According to an embodiment, the heatsink sheet 250, the shielding member, the protection film, the black pet, and/or the sponge described above may have an opening formed on an area thereof corresponding to the first opening 213 and/or the second opening 214.

Figure 5:
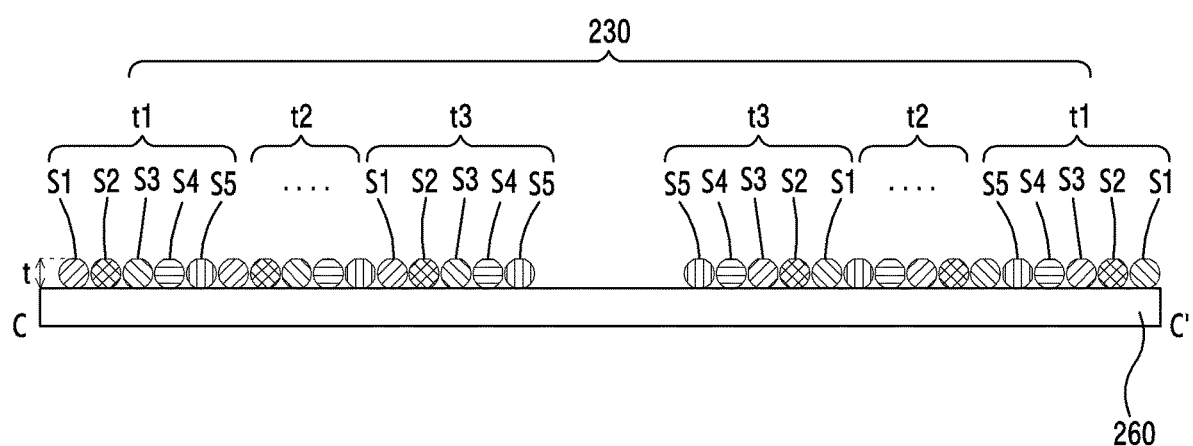
FIG. 5 is a cross-sectional view of one coil for supporting wireless communication technology, included in an electronic device according to one of certain embodiments.

FIG. 5 is a cross-sectional view of one coil for supporting wireless communication technology, included in an electronic device according to one of certain embodiments. In this case, FIG. 5 illustrates a cross section of the structure 200 of the coils of FIG. 3 taken on line C-C'.

Referring to FIG. 5, the second coil 230 according to certain embodiments may have at least one wire wound on the same plane of a support member 260 supporting the second coil 230 by at least one turn. Herein, the number of wires forming the second coil 230 may be defined as the number of strands, and when an angle at which the at least one wire is wound reaches a multiple of 360 degrees, the multiple may be defined as the number of turns. FIG. 5 is a cross-sectional value of the second coil 230 when the second soil 230 is implemented by five strands and three turns. The second coil 230 may be formed with the first strand S1 positioned on an outermost portion and the second strand S2, the third strand S3, the fourth strand S4, and the fifth strand S5 positioned in sequence from the first strand S1, and the respective strands S1 to S5 may be arranged in parallel and may be wound from outside to inside, forming the first turn t1 on the outermost portion and forming the second turn t2, the third turn t3 in sequence, such that the second coil 230 has a spiral pattern.

When an electric current flows through a conductor, the electric current flows along some surfaces of the cross-sectional area of the conductor, rather than flowing through the whole cross-sectional area of the conductor, and this may be defined as a so-called "skin effect." That is, the skin effect refers to a phenomenon in which, when a high frequency current flows through a conductor, the current flows along a surface of the conductor and excluding an interior. The reason why the skin effect occurs is that the direction of a current flowing along a conductor is swiftly changed and thus a counter electromotive force is generated in the conductor, making it difficult for the current to flow through the center of the conductor.

When a current is applied to a normal spiral wire, the current flowing through each turn (such as, for example, turns t1 to t3 of the second coil) may not uniformly flow due to the skin effect, and may rush toward an outer turn of the spiral pattern and may flow leaning to one side. Accordingly, since there may be an area in which the current does not flow, an amount of current flowing through the conductor may be limited and a resistance value may increase, and as a result, power transmission and reception efficiency (or wireless charging efficiency) may be degraded.

In certain embodiments, to reduce the degradation of the wireless charging efficiency due to the above-described factors, the resistance of the second coil 230 may be reduced by implementing each turn (t1–t3) of the second coil 230 by arranging in parallel the wires of the plurality of strands, as shown in FIG. 5. As the resistance of the second coil 230 is reduced, the frequency characteristics (such as, for example, Q-factor) of the second coil 230 can be enhanced, and as a result, a loss occurring in a wireless charging process can be reduced, and the wireless charging efficiency can be enhanced.

TABLE 1

| Classification | Wireless charging coil according to comparison embodiment | Wireless charging coil 1 | Wireless charging coil 2 | Wireless charging coil 3 |
| --- | --- | --- | --- | --- |
| Implementation type | Circuit wire on both surfaces of FPCB (11 turns) | Wire (12 strands, 13 turns) | Wire (11 strands, 13 turns) | Wire (11 strands, 14 turns) |
| Inductance (µH) | 9.44 | 9.32 | 9.02 | 10.21 |
| Resistance (mohm) | 605 | 516 | 522 | 564 |
| Wireless charging efficiency (%) | 81.4 | 82.6 | 82 | 81.7 |

Table 1 described above shows inductance, resistance, and wireless charging efficiency of wireless charging coils of various forms. The inductance and the resistance were measured in a wireless charging process using a frequency of 200 kHz, and the wireless charging efficiency was measured in a condition where a current of 1.25 A flows through the wireless charging coil. The wireless charging coil according to the comparison embodiment of table 1 refers to a coil formed on both surfaces of an FPCB, and the wireless charging coil 1, the wireless charging coil 2, and/or the wireless charging coil 3 refer to various examples of wires implementing the second coil 230 of FIGS. 2, 3, 4, and 5. In addition, the wireless charging coil according to the comparison embodiment, the wireless charging coil 1, the wireless charging coil 2, and the wireless charging coil 3 had the same diameter and the same inner diameter, and the wireless charging coil 1, the wireless charging coil 2, and the wireless charging coil 3 was implemented with the same thickness t.

The wireless charging coil according to the comparison embodiment of table 1 of the disclosure may include a plurality of coils formed on the FPCB. In an example, the wireless charging coil according to the comparison embodiment may include a coil for NFC for transmitting power and/or data, a coil for wireless charging, and a coil for MST. In an embodiment, in the wireless charging coil according to the comparison embodiment, the coil for NFC, the coil for wireless charging, the coil for MST may be arranged on the FPCB to have the same center. However, in the case of the above-described structure, arrangements of the coils may become complicated to prevent degradation of performance caused by interference between the coils, and, since the wireless charging coil is formed on the FPCB, there may be a limit to the number of strands of wireless charging coils that may be divided to increase charging efficiency.

Referring to table 1 described above, it can be seen that resistances of the wireless charging coils 1 to 3 according to certain embodiments, formed by wires, were reduced compared to the wireless charging coil according to the comparison embodiment. In addition, it can be seen that, since it is easier to divide the wireless charging coil (for example, the second coil 230) according to certain embodiments of the disclosure into strands than the wireless charging coil formed on the FPCB, the wireless charging efficiency was enhanced.

Referring to table 1 described above, when the second coil 230 is formed by winding wires having 10-14 strands by 11-16 turns according to certain embodiments, the second coil 230 may have inductance of 8 to 11 pH, and in this case, the second coil 230 may have relatively higher wireless charging efficiency than the wireless charging coil formed on the FPCB. Accordingly, the second coil 230 formed by winding the wires having 10 to 14 strands by 11 to 16 turns may be appropriate as a wireless charging coil.

According to certain embodiments, the second coil 230 may be used not only as a wireless charging coil, but also as an MST coil. In the disclosure, MST technology refers to technology that generates a magnetic field and enables recognition in the same way as a card reader swipes on a magnetic card, and the MST technology does not have a separate resonance frequency.

Since communication performance is proportional to an intensity of a magnetic field that an MST coil can generate according to the MST communication technology, the second coil 230 according to certain embodiments of the disclosure may be formed by wires including a plurality of strands, and, optionally may be disposed on a different area not to coincide with the center of an NEC coil (for example, the first coil 220). Since the second coil 230 is disposed on a different area from the NEC coil as described above, the second coil 230 according to an embodiment may be coupled with a magnetic substance having high permeability. Since a high frequency tangent loss increases as the permeability of the NEC coil increases, if the NFC coil and the second coil 230 are positioned adjacent to each other (for example, at the same center), the second coil 230 may not be coupled with a magnetic substance having high permeability. However, in an embodiment, the NEC coil and the second coil 230 are disposed on different areas as described above, such that the second coil 230 can be coupled with a magnetic substance having high permeability and can generate a magnetic field of an intensity suitable for MST communication technology. Accordingly, the second coil 230 may be used as an MST coil in addition to a wireless charging coil.

Figure 6:
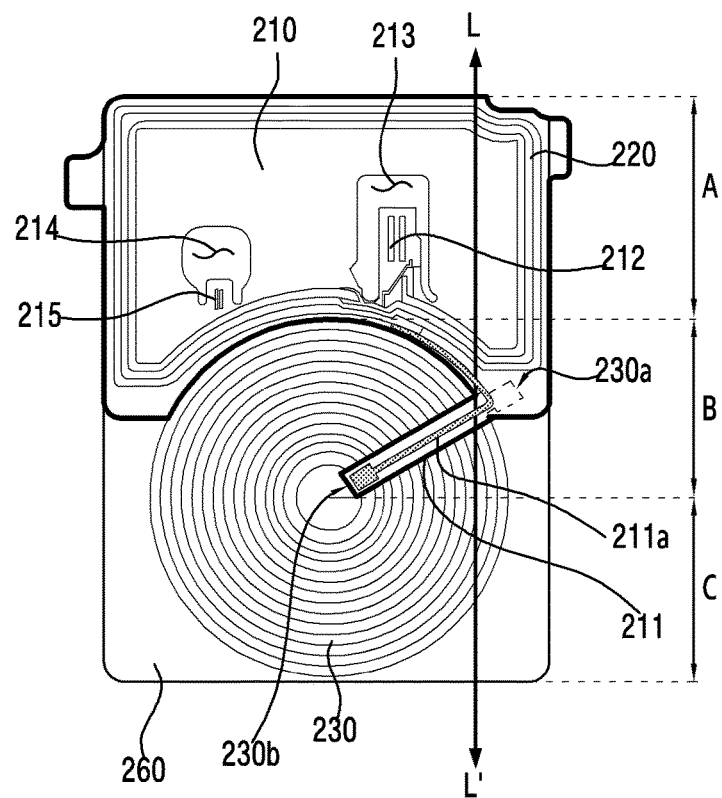
FIG. 6 is a view illustrating structures of coils for supporting wireless communication technology, included in an electronic device according to one of certain embodiments, and illustrating a cross-section of the structures of the coils, taken on line L-L'.
Figure 6:
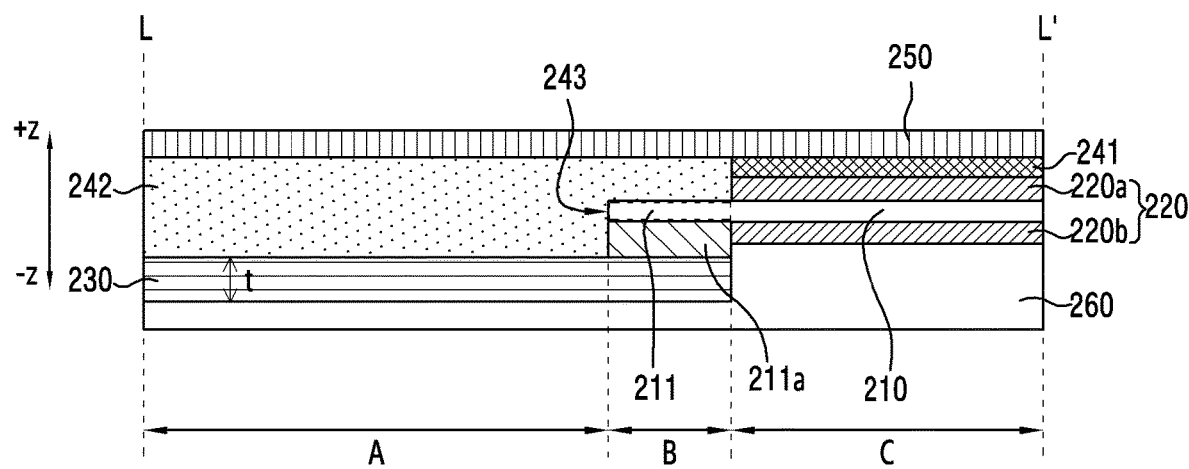
Figure 7:
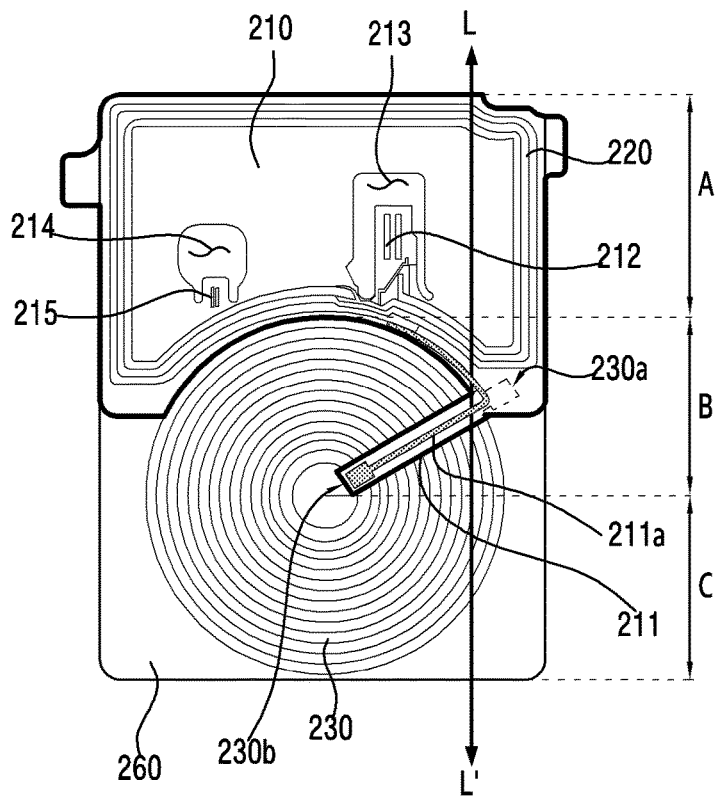
FIG. 7 is a view illustrating structures of coils supporting wireless communication technology, included in an electronic device according to another embodiment, and illustrating a cross-section of the structures of the coils, taken on line L-L'.
Figure 7:
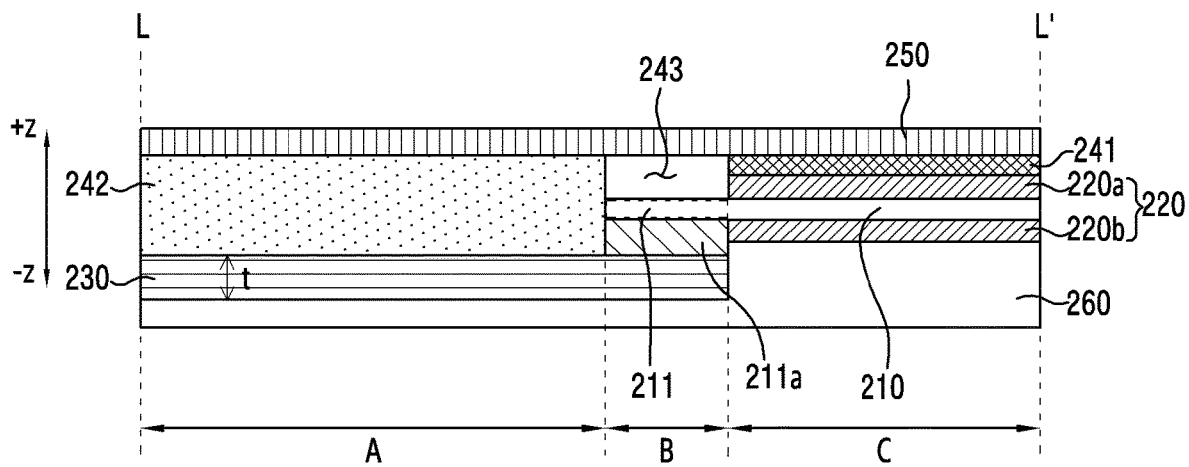

FIG. 6 is a view illustrating a structure of coils for supporting wireless communication technology, included in an electronic device according to certain embodiments, and a cross-sectional view of the structure of the coils taken on line L-L'. FIG. 7 is a view illustrating a structure of coils for supporting wireless communication technology, included in an electronic device according to another embodiment, and a cross-sectional view of the structure of the coils taken on line L-L'. Referring to FIGS. 6 and 7, the structure illustrated in FIGS. 6 and 7 may be divided into an C area in which a second coil 230 (such as, for example, the second coil 230 of FIG. 4) is formed, a B area in which the second coil 230 and a protrusion 211 of an FPCB 210 (such as, for example, the protrusion 211 of FIG. 4) overlap each other, and an area in which a first coil 220 (such as, for example, the first coil 220 of FIG. 4) and the FPCB 210 overlap each other.

In the C area, the second coil 230 having a thickness t may be stacked on a support member 260, a second magnetic substance 242 may be stacked on the second coil 230, and a heatsink sheet 250 may be stacked on the second magnetic substance 242. That is, in the C area, the support member 260, the second coil 230, the second magnetic substance 242, and the heatsink sheet 250 may be stacked in sequence from a lower end to an upper end (such as, for example, from the −z direction to the +z direction).

In the B area, the second coil 230 having the thickness t may be stacked on the support member 260, the protrusion 211 of the FPCB 210 may be stacked on the second coil 230, at least a certain area of the second magnetic substance 242 may be stacked on the protrusion 211, and the heatsink sheet 250 may be stacked on the second magnetic substance 242.

The protrusion 211 may be a portion of the FPCB 210, and may have a circuit wire 211a formed on one surface thereof (such as, for example, one surface in the −z direction). The circuit wire 211a may serve as a lead cable for connecting the second coil 230 with a connection terminal 212. If the second coil 230 is wound from outside to inside and then one end existing inside the coil is directly drawn out to be connected with the connection terminal 212, the structure 200 of the coils for supporting wireless communication technology may become thicker since the thickness t of the wire forming the second coil 230 is thicker than the FPCB 210, and it may be difficult to use the structure 200 in an electronic device having a limit to thickness. Accordingly, in certain embodiments of the disclosure, the thickness can be reduced by connecting both ends (for example, 230a, 230b of FIGS. 3, 4) of the second coil 230 to the FPCB 210.

In addition, in the B area, at least one recess 243 may be formed on at least a certain area of the second magnetic substance 242 according to certain embodiments to prevent thickness of the B area from increasing or to compensate for an increase in thickness to make thickness of the B area and thickness of the C area identical. In an example (e.g., FIG. 6), the recess 243 (e.g., the recess 243 of FIG. 4) may be formed by removing a certain area of the second magnetic substance 242 corresponding to the protrusion 211 in part. In another example (e.g., see FIG. 7), the recess 243 may be formed by removing a certain area of the second magnetic substance 242 corresponding to the protrusion 211, and accordingly, the second magnetic substance 242 may be excluded from the B area.

According to another embodiment, a certain area of the heatsink sheet 250 stacked on the second magnetic substance 242 in the B area may be removed to have smaller thickness than in the A area or the C area, and by doing so, the thickness of the B area can be prevented from increasing.

In the A area, the first coil 220 having a first wire 220a and a second wire 220b formed on both surfaces of the FPCB 210 may be stacked on the support member 260, a first magnetic substance 241 may be stacked on the first coil 220, and the heatsink sheet 250 may be stacked on the first magnetic substance 241.

An electronic device (such as, for example, the electronic device 101 of FIG. 1, the electronic device 1001 of FIG. 2) according to certain embodiments of the disclosure may include: a wireless communication circuit; an FPCB (such as, for example, the FPCB 210 of FIG. 3) electrically connected with the wireless communication circuit; a first coil (for example, the first coil 220 of FIG. 3) formed on the FPCB; a power management circuit; and a second coil (such as, for example, the second coil 230 of FIG. 3) electrically connected with the power management circuit and having a spiral pattern formed by winding at least one wire, and the second coil may include a first end (such as, for example, 230a of FIG. 4) positioned on an outer edge of the spiral pattern, and a second end (such as, for example, 230b of FIG. 4) positioned on an inner edge of the spiral pattern, and an electric path (such as, for example, the electric wire 211a of FIG. 3) extended from the second end to the first end may be disposed on the FPCB.

According to an embodiment, a coil center of the first coil and a coil center of the second coil may be disposed to be misaligned from each other.

According to an embodiment, the first coil and the second coil may be disposed not to overlap each other (i.e., non-overlapping).

According to an embodiment, the electronic device may further include a first magnetic substance (such as, for example, the first magnetic substance 241 of FIG. 4) disposed to cover the first coil, and a second magnetic substance (such as, for example, the second magnetic substance 242 of FIG. 4) disposed to cover the second coil.

According to an embodiment, the second magnetic substance may have a different magnetic characteristic from that of the first magnetic substance.

According to an embodiment (such as, for example, see FIG. 6), a thickness of a portion of the second magnetic substance that covers an area in which the second coil and the FPCB overlap each other may be thinner than a thickness of the other portion of the second magnetic substance that covers the second coil.

According to an embodiment, the wireless communication circuit may be configured to perform near field communication by using the first coil.

According to an embodiment, the electronic device may further include a battery, and the power management circuit may be configured to wirelessly charge the battery by using the second coil.

According to an embodiment, the electronic device may further include an MST control circuit, and the MST control circuit may be configured to transmit an MST signal for paying by using the second coil.

According to an embodiment, the spiral pattern of the second coil may be formed by winding a plurality of wires arranged in parallel.

According to an embodiment, the plurality of wires may include substantially 10 to 14 wires.

According to an embodiment, the plurality of wires may be wound as to have substantially 11 to 16 turns.

According to an embodiment, the FPCB may include a protrusion (such as, for example, the protrusion 211 of FIG. 4), and the protrusion may be extended from the first end of the second coil to the second end, and the electric path may be formed on the protrusion as a circuit wire (such as, for example, the circuit wires 211a of FIG. 4).

According to an embodiment, the first magnetic substance may include a ferrite sheet.

According to an embodiment, the second magnetic substance may include a metal sheet.

According to certain embodiments of the disclosure, an electronic device (such as, for example, the electronic device 101 of FIG. 1) may include: an FPCB (such as, for example, the FPCB 210 of FIG. 2) including a connection terminal (for example, the connection terminal 212 of FIG. 3) electrically connected with components included in the electronic device; a first coil (such as, for example, the first coil 220 of FIGS. 2, 6) including a first wire (for example, the first wire 220a of FIG. 6) formed on a first surface of the FPCB, and a second wire (for example, the second wire 220b of FIG. 6) formed on a second surface of the FPCB facing in the opposite direction of the first surface; and a second coil such as, (for example, the second coil 230 of FIG. 2) having a spiral pattern formed by winding at least one wire by at least one turn, and the second coil may include a first end (such as, for example, 230a of FIG. 4) positioned on an outer edge of the spiral pattern, and a second end (such as, for example, 230b of FIG. 4) positioned on an inner edge of the spiral pattern, and an electric path (for example, the circuit wire 211a of FIG. 2) connecting each of the first end and the second end with the connection terminal may be formed on the FPCB.

According to an embodiment, a coil center of the first coil and a coil center of the second coil may be disposed to be misaligned from each other.

According to an embodiment, the first coil and the second coil may be disposed not to overlap each other.

According to an embodiment, the electronic device may further include a first magnetic substance (for example, the first magnetic substance 241 of FIG. 4) disposed to cover the first coil, and a second magnetic substance (for example, the second magnetic substance 242 of FIG. 4) disposed to cover the second coil.

According to an embodiment, the second magnetic substance may have a different magnetic characteristic from that of the first magnetic substance.

The electronic device according to certain embodiments includes a coil formed as a wire and a coil formed on an FPCB, so that coils appropriate to a plurality of communication technologies for exchanging power or data with an external electronic device can be provided.

The electronic device according to certain embodiments can reduce interference between coils by arranging the coil formed as a wire and the coil formed on the FPCB to have their centers misaligned from each other, and can enhance performances of the respective coils by using magnetic substances corresponding to frequency characteristics of communication technologies applied to the respective coils.

The electronic device according to certain embodiments can save a manufacturing cost by reducing use of a high-priced FPCB.

The effects achieved by the disclosure is not limited to those mentioned above, and other effects that are not mentioned above may be clearly understood to those skilled in the art based on the description provided above.

The electronic device according to certain embodiments may be one of various types of electronic devices. The electronic devices may include, for example, a portable communication device (e.g., a smartphone), a computer device, a portable multimedia device, a portable medical device, a camera, a wearable device, or a home appliance. According to an embodiment of the disclosure, the electronic devices are not limited to those described above.

It should be appreciated that certain embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Certain embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. The term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to certain embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to certain embodiments, each component (e.g., a module or a program) of the above-described components may include a single entity or multiple entities. According to certain embodiments, one or more of the above-described components may be omitted, or one or more other components may be added. Alternatively or additionally, a plurality of components (e.g., modules or programs) may be integrated into a single component. In such a case, according to certain embodiments, the integrated component may still perform one or more functions of each of the plurality of components in the same or similar manner as they are performed by a corresponding one of the plurality of components before the integration. According to certain embodiments, operations performed by the module, the program, or another component may be carried out sequentially, in parallel, repeatedly, or heuristically, or one or more of the operations may be executed in a different order or omitted, or one or more other operations may be added.

What is claimed is:

1. An electronic device, comprising:
   a wireless communication circuit;
   an flexible printed circuit board (FPCB) electrically coupled with the wireless communication circuit;
   a first coil formed on the FPCB;
   a power management circuit; and
   a second coil electrically coupled with the power management circuit and including a spiral pattern formed thereon by a winding at least one wire,
   wherein the second coil includes a first end disposed on an outer edge of the spiral pattern, and a second end disposed on an inner edge of the spiral pattern, and
   wherein an electric path extending from the second end to the first end is disposed on the FPCB.

2. The electronic device of claim 1, wherein a coil center of the first coil and a coil center of the second coil are disposed as to be misaligned relative to one another.

3. The electronic device of claim 2, wherein the first coil and the second coil are disposed as to be non-overlapping relative to one another.

4. The electronic device of claim 1, further comprising:
   a first magnetic substance covering the first coil; and
   a second magnetic substance covering the second coil.

5. The electronic device of claim 4, wherein the second magnetic substance includes a magnetic characteristic different from that of the first magnetic substance.

6. The electronic device of claim 5, wherein the first magnetic substance includes a ferrite sheet.

7. The electronic device of claim 4, wherein a first portion of the second magnetic substance covers an area in which the second coil and the FPCB overlap,
   wherein a second portion of the second magnetic substance covers the second coil, and
   wherein a thickness of the first portion is thinner than a thickness of the second portion.

8. The electronic device of claim 5, wherein the second magnetic substance includes a metal sheet.

9. The electronic device of claim 1, wherein the wireless communication circuit is configured to perform near field communication (NFC) using the first coil.

10. The electronic device of claim 1, further comprising a battery,
    wherein the power management circuit is configured to wirelessly charge the battery using the second coil.

11. The electronic device of claim 10, further comprising a magnetic secure transmission (MST) control circuit,
    wherein the MST control circuit is configured to transmit a MST signal using the second coil.

12. The electronic device of claim 1, wherein the spiral pattern of the second coil is formed by winding a plurality of wires in a parallel arrangement.

13. The electronic device of claim 12, wherein the plurality of wires includes substantially 10 to 14 individual wires.

14. The electronic device of claim 12, wherein the plurality of wires are wound to include substantially 11 to 16 turns.

15. The electronic device of claim 1, wherein the FPCB comprises a protrusion, and
    wherein the protrusion extends from the first end of the second coil to the second end, and the electric path is formed on the protrusion as a circuit wire.

* * * * *